(12) United States Patent
Beard

(10) Patent No.: US 6,538,902 B1
(45) Date of Patent: Mar. 25, 2003

(54) MODEM SHELF

(75) Inventor: James Lamar Beard, Cumming, GA (US)

(73) Assignee: Nortel Networks Limited, St. Laurent (CA)

(*) Notice: Subject to any disclaimer, the term of this patent is extended or adjusted under 35 U.S.C. 154(b) by 0 days.

(21) Appl. No.: 09/223,005

(22) Filed: Dec. 30, 1998

(51) Int. Cl.⁷ .................................................. H05K 9/00
(52) U.S. Cl. ........................ 361/818; 361/800; 361/816
(58) Field of Search ............................. 361/752–754, 361/756, 796, 800, 801, 802, 816, 818; 174/35 R, 51; 312/223.2; 211/26

(56) References Cited

U.S. PATENT DOCUMENTS

| | | | | |
|---|---|---|---|---|
| 4,620,265 A | * | 10/1986 | Lerude et al. | 361/424 |
| 4,630,175 A | * | 12/1986 | Lerude et al. | 361/424 |
| 4,716,497 A | * | 12/1987 | Craker | 361/736 |
| 4,894,753 A | * | 1/1990 | Wadell et al. | 361/818 |
| 5,323,299 A | * | 6/1994 | Weber | 361/818 |
| 5,761,033 A | * | 6/1998 | Wilhelm | 361/684 |
| 5,859,767 A | * | 1/1999 | Fontana | 361/818 |
| 5,966,289 A | * | 10/1999 | Hastings et al. | 361/704 |
| 6,008,995 A | * | 12/1999 | Pusateri et al. | 361/796 |
| 6,053,760 A | * | 4/2000 | Bailis et al. | 439/377 |
| 6,104,613 A | * | 8/2000 | Urda et al. | 361/704 |
| 6,154,361 A | * | 11/2000 | Anderson et al. | 361/685 |
| 6,169,662 B1 | * | 1/2001 | Clark et al. | 361/754 |
| 6,209,842 B1 | * | 4/2001 | Anderson et al. | 248/560 |

* cited by examiner

Primary Examiner—Albert W. Paladini
Assistant Examiner—Tuan Dinh
(74) Attorney, Agent, or Firm—Withrow & Terranova, P.L.L.C.

(57) ABSTRACT

A modem shelf is described in which internal dividers separate the interior of the shelf into individually isolated Faraday cages that effectively suppress EMI generated by circuit cards mounted within the shelf and isolate the circuit cards from EMI originating outside the shelf and from cards mounted within the shelf. The shelf enables high-speed data communications over a twisted pair network of about 10 Mbps or more. The top and bottom of the shelf are made of relatively thin sheet material, which maximizes the vertical dimension of the circuit cards mounted in the shelf and thus the area on which circuitry can be placed.

16 Claims, 8 Drawing Sheets

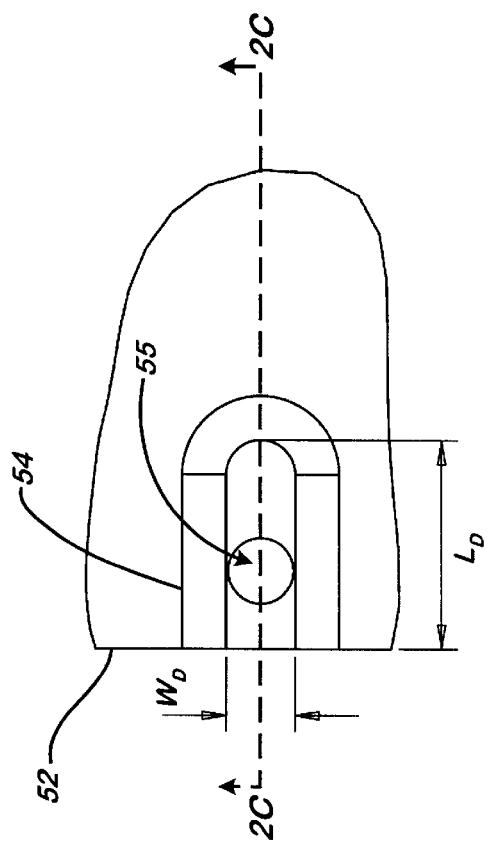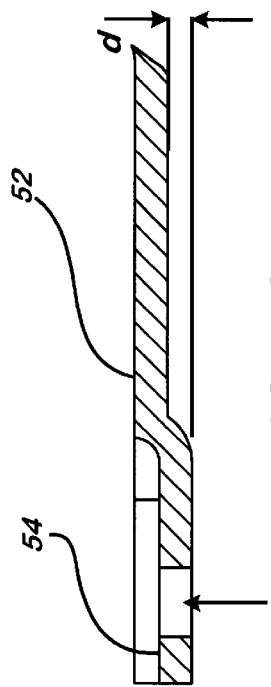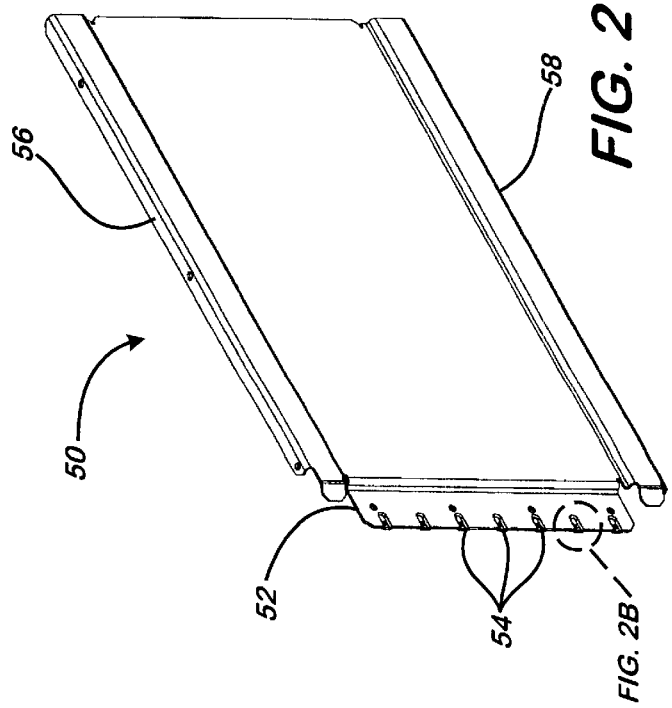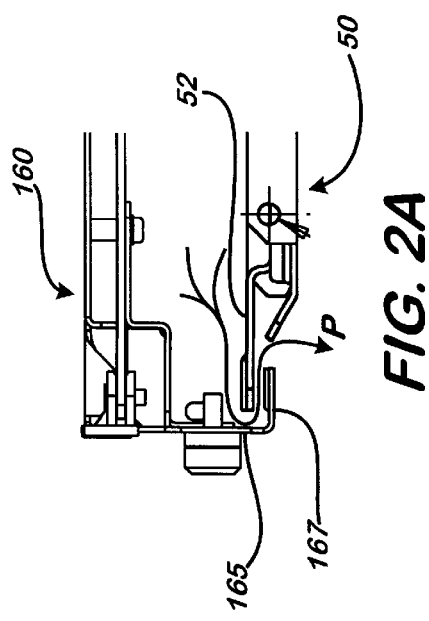
FIG. 2
FIG. 2A
FIG. 2B
FIG. 2C

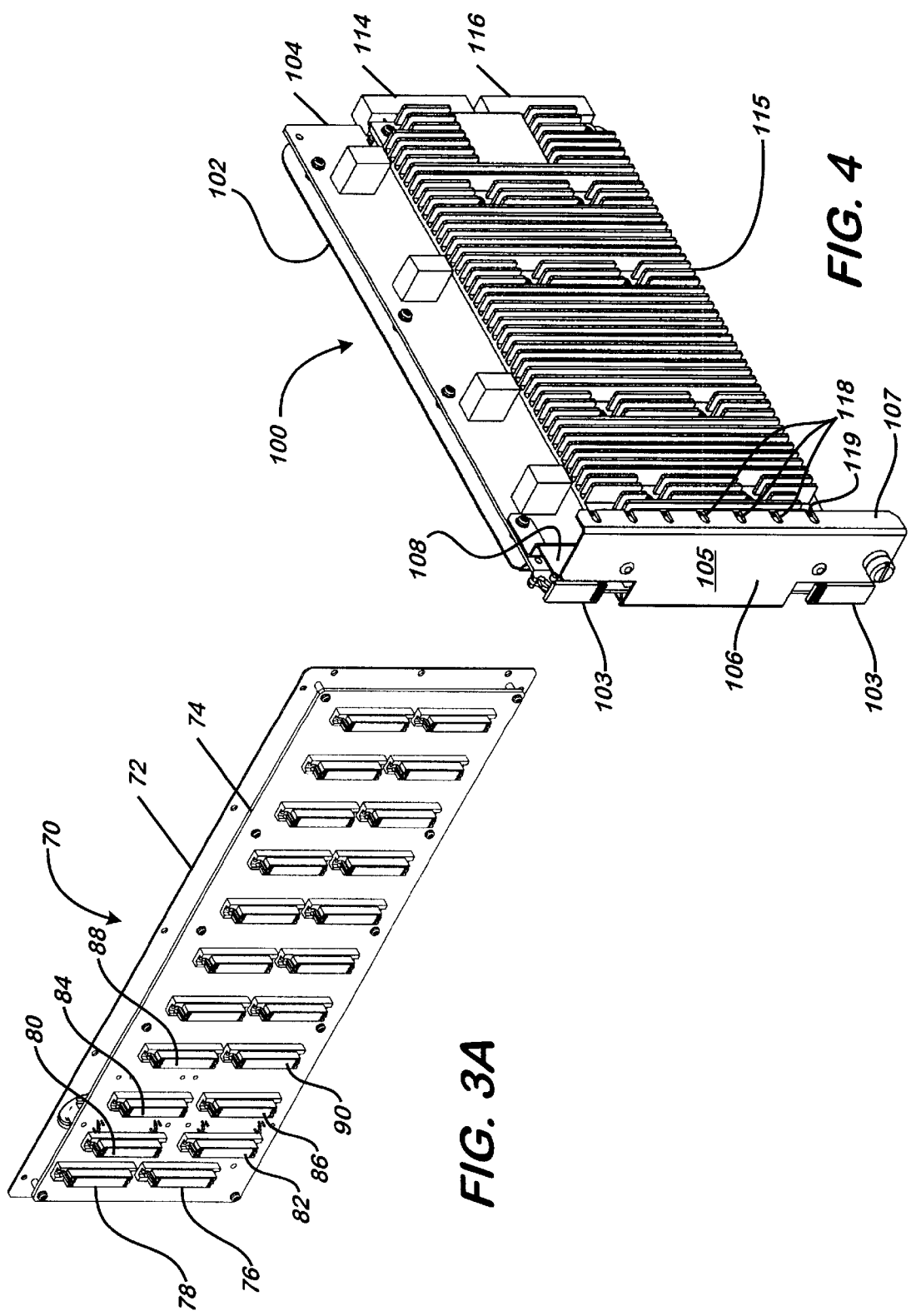

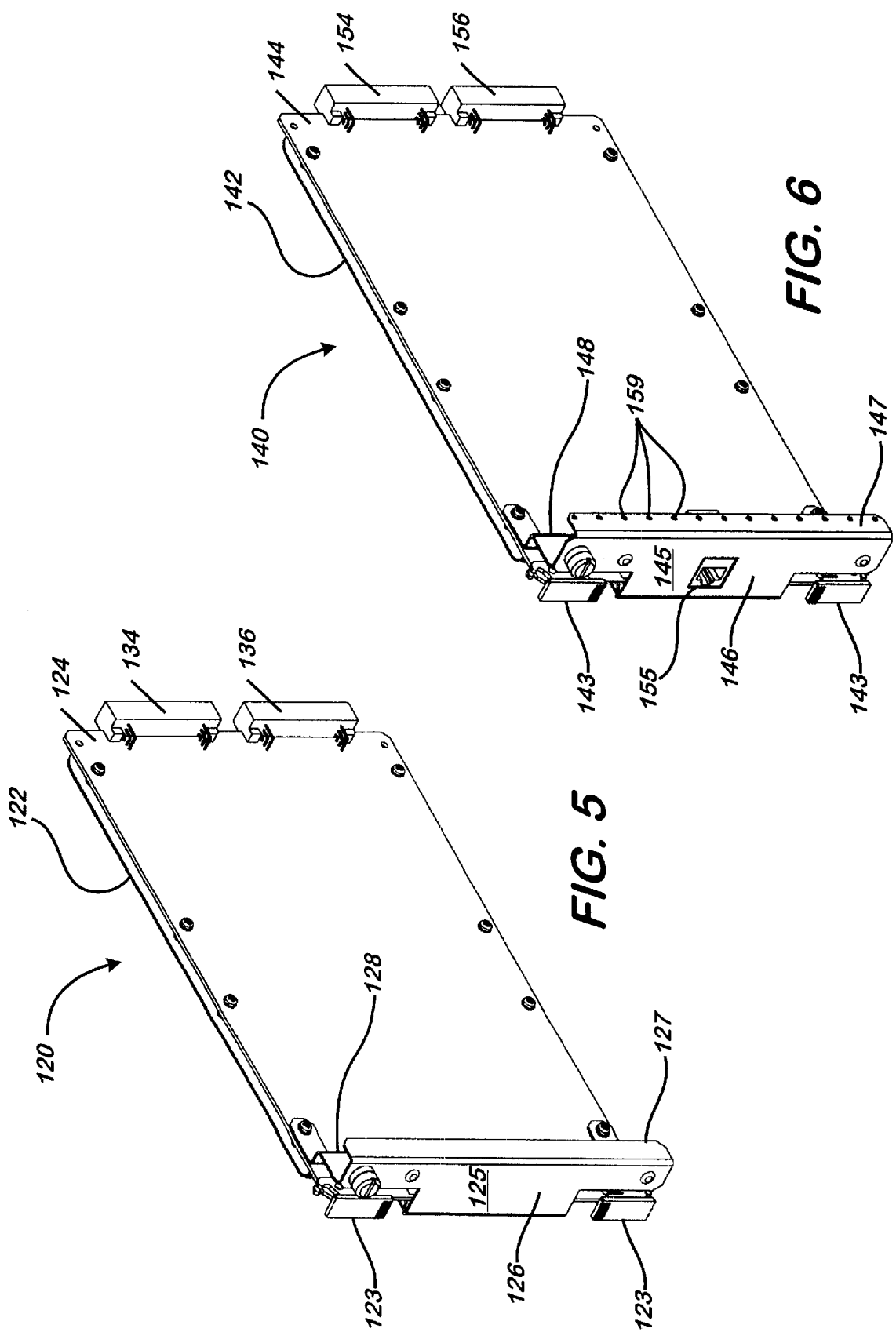

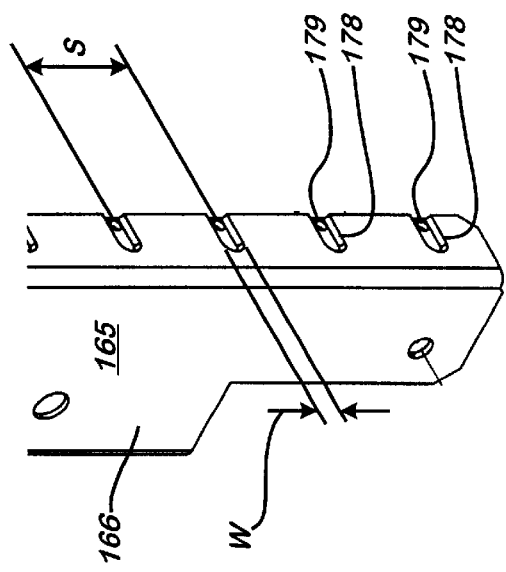
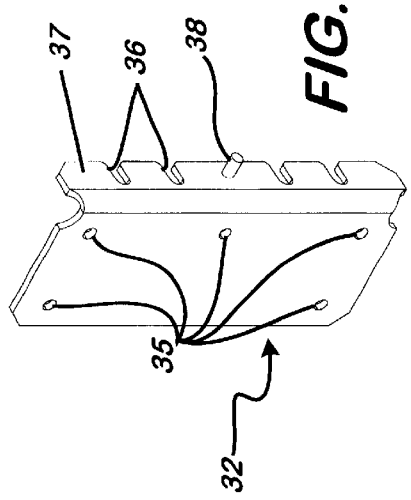
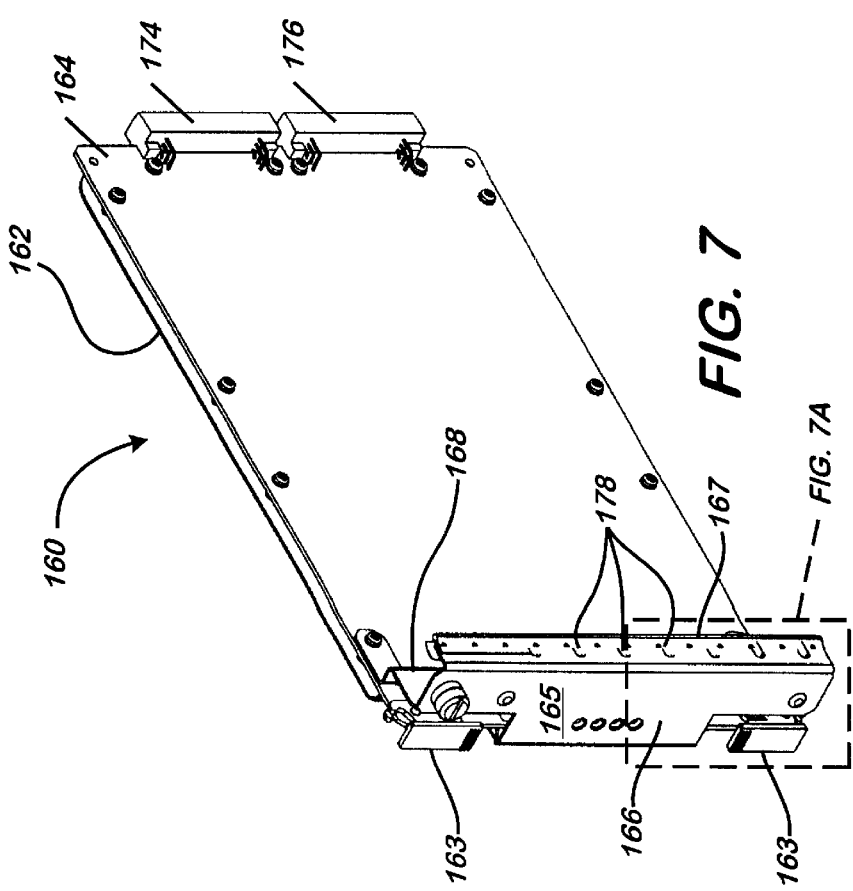

MODEM SHELF

I. BACKGROUND OF THE INVENTION

A. Field of the Invention

The present invention relates to a shelf in a relay rack for mounting multiple circuit boards in individual EMI-suppressing card slots. More specifically, the present invention relates to a shelf in a relay rack for mounting a power card, a filter card, a hub card, and multiple modem cards in individual EMI-suppressing card slots.

B. Description of the Prior Art

Computer network traffic on LANs and WANs passes at a variety of data transfer rates and through a wide array of equipment including hubs, switches, routers, servers, modems, and filters. A variety of cabling is used to support such traffic, including twisted pair cable, coaxial cable, and fiber optics cable. Each type of cable has advantages and disadvantages.

The primary advantage of twisted pair is that it is inexpensive to install and it is already widely installed. Virtually all homes and businesses in the United States have access to plain old telephone service ("POTS"), which uses twisted pair. However, current commercially available modem technology using POTS permits only a relatively low data transfer rate of 56 Kbps. An emerging commercially available technology, asymmetric digital subscriber line ("ADSL"), also uses POTS and could speed downstream (into the user's computer) data transfer rates to as high as 8 Mbps, with 1.5 Mbps a more likely average transfer rate. However, even the downstream data transfer rate possible with ADSL may not be high enough to satisfy demand. And the upstream (leaving the user's computer) data transfer rate for commercially available ADSL is LAW OFFICES it currently limited to 56 Kbps. Additionally, ADSL has been found to be affected by noise from adjacent circuitry. When noise is detected in an ADSL datastream, the transfer rate is automatically decreased in order to attempt to eliminate the effect of the noise.

Cable modems can support downstream data transfer rates at higher speeds of up to 30 Mbps. However, such high-speed service is only available to users with access to a coaxial cable connection, typically a cable television network. Such connections exist in far fewer homes and businesses in the United States than POTS. Moreover, current cable modems also suffer from a relatively slow, 56 Kbps, upstream data transfer rate.

Optical fiber can support data transfer rates of at least 500 Mbps and can transmit signals over the longest distances without repeaters. Fiber-based network segments can be extended 20 times farther than the copper segments of POTS. Additionally, fiber is immune to EMI, which reduces the number of retransmissions required. However, very few homes and businesses have access to a fiber-only network, and installation of a fiber-only network likely will require billions of dollars and many years to complete.

Because POTS is so widely available today, adaptation of a twisted-pair network for high-speed data transfers of 10–100 Mbps is highly desirable. However, current attempts at such adaptation are limited to the relatively short, 100-meter runs of cable in a typical Ethernet network. Current Ethernet connections cannot be extended more than about 1 kilometer. EMI essentially overwhelms the data signal transmitted over twisted-pair lines in cable runs longer than these relatively short distances. Primary sources of EMI on twisted-pair cables are the points at which cable is physically located near noise-emitting electronic equipment, like a modem shelf.

Where cable runs converge in a modem shelf, the modem circuitry and the cables themselves all act as broadcast antennae that generate EMI, which of course, is received by neighboring circuitry and cabling acting as receiving antennae. Current modem shelves do little to suppress EMI because, at today's 56-Kbps data rates, EMI does not create problems. Essentially, EMI is typically at a high enough frequency (when compared to a 56-Kbps signal) that the EMI does not unduly degrade the shape of the signal. In the Ethernet environment, EMI is addressed by keeping cable runs short and shielding cable and equipment. Modems, hubs, routers, power cards and other devices on circuit cards are all mounted side by side in typical modem shelves. The more densely the cards are packed in a shelf, the greater the number of physical lines that can be installed within a given space.

To support higher data transfer rates over the twisted-pair cabling of POTS, EMI generated in modem shelves must be minimized. One method of suppressing EMI is to surround electrical circuitry or other EMI-generating devices with a grounded, metallic box, commonly called a Faraday cage. Conventional modem shelves act to some degree as Faraday cages for the entire group of cards installed in them. However, such conventional shelves have no structure or other mechanism for isolating individual cards from EMI generated by neighboring cards. Additionally, EMI originating outside the shelf creeps into the interior of the shelf through the front and back of the shelf. Conventional modem shelves thus do not provide sufficient EMI suppression to enable high-speed data communications using POTS.

II. SUMMARY OF THE INVENTION

A modem shelf according to the present invention fits within standard racks used to mount circuit cards. The shelf comprises top, bottom, side and back plates made of aluminum, but any EMI-suppressing material is appropriate. These plates suppress EMI that might enter the shelf from the outside and EMI that might leave the shelf and interfere with operation of cards in adjacent shelves or "pollute" signals traveling through nearby cabling. Dividers, also made of aluminum or other EMI-suppressing material, separate the interior of the shelf into individual card slots and suppress EMI that would otherwise pass between cards. Individual front plates suppress EMI entering or leaving through the front end of the shelf. These front plates may or may not be part of the circuit card assemblies, but they are part of the card assemblies in the preferred embodiment of the invention. Thus, each card slot provides an environment isolating cards in the shelf from surrounding EMI and suppressing EMI generated by the cards. The shelf's EMI-isolation and -suppression characteristics enable the circuit cards mounted in the shelf to perform without EMI-induced problems and preserves the integrity of high-speed data streams carried through nearby twisted pair cables and electronic circuitry.

The invention, as embodied and broadly described below, is a shelf for mounting a plurality of circuit cards, comprising: an exterior shell made of EMI-shielding material and defining an internal space, comprising: a top, a first side connected to the top, a second side connected to the top, and a bottom connected to the first side and the second side; and a divider made of EMI-shielding material that: is connected to the top of the exterior shell and the bottom of the exterior shell and separates the internal space into a first card slot and a second card slot; such that the portion of the exterior shell surrounding each of the first and second card slots and the divider suppresses EMI generated by one of the circuit cards mounted in either the first or the second card slot.

The shelf may also comprise divider plates, attached to the card assemblies in the preferred embodiment, which further suppress EMI emitted in a direction perpendicular to the circuit cards. The front plates on each card assembly may be bent inward toward the interior of the shelf so that the bent portion overlaps with the front edge of one of the dividers connected to the top and bottom of the shelf. This overlap "seals" the front side of the card slot and prevents EMI from leaving through the front plate. The bent portion of the front plates and the front edges of the dividers may also include stamped protrusions with apertures extending through the protrusions, which further suppress EMI emitted toward the front plate. The mounting brackets attached to the sides of the shelf may be configured to be attached in multiple locations and orientations so that the same bracket can be used to mount the shelf in a variety of relay racks. Holes may extend through the top and bottom of the shelf to aid in cooling the circuitry on the cards mounted in the shelf. The holes in the top are small enough to prevent debris (e.g., a #4 screw) from falling into the interior of the shelf and the holes in the bottom are large enough to allow debris to fall out of the shelf.

The preceding general description of the invention and the following detailed description are exemplary and explanatory only and do not restrict the claims directed to the invention. The accompanying drawings, which are part of this specification, illustrate one embodiment of the invention and together with the description, serve to explain the principles of the invention.

III. BRIEF DESCRIPTION OF THE DRAWINGS

FIG. 2 is a perspective of a card slot divider to be connected to the top and bottom of the modem shelf of FIG 1.

FIG. 2A is a detail partial plan view of the divider of FIG. 2 from above and a portion of a modem card assembly compatible with the shelf of FIG. 1 illustrating the spatial relationship between the front edge of the divider and the front plate of the modem card assembly when the modem card assembly is mounted in the shelf of FIG. 1.

FIG. 2B is a detail partial elevation view illustrating the EMI-suppression protrusions shown along the end of the divider of FIG. 2.

FIG. 2C is a detail partial cross-sectional view of the divider taken along line 2C—2C of FIG. 2B.

FIG. 3A is a front perspective view of the back plane assembly shown in FIG. 3.

FIG. 4 is a perspective view of a power card assembly compatible with the modem shelf of FIG. 1 illustrating a heat sink on the left-facing side of the power card assembly when the assembly is installed in the shelf.

FIG. 5 is a perspective view of a filter card assembly compatible with the modem shelf of FIG. 1.

FIG. 6 is a perspective view of a hub card assembly compatible with the modem shelf of FIG. 1.

FIG. 7 is a perspective view of a modem card assembly compatible with the modem shelf of FIG. 1.

FIG. 7A is a partial perspective view of the front plate of the modem card assembly of FIG. 7 illustrating EMI-suppression protrusions located on the inner side wall of the front plate.

FIG. 8 is a perspective view of a bracket allowing the modem shelf of FIG. 1 to be mounted in a number of different standard relay racks by appropriately attaching and orienting the bracket on different parts of the shelf.

IV. DESCRIPTION OF THE PREFERRED EMBODIMENT

Figure 1:
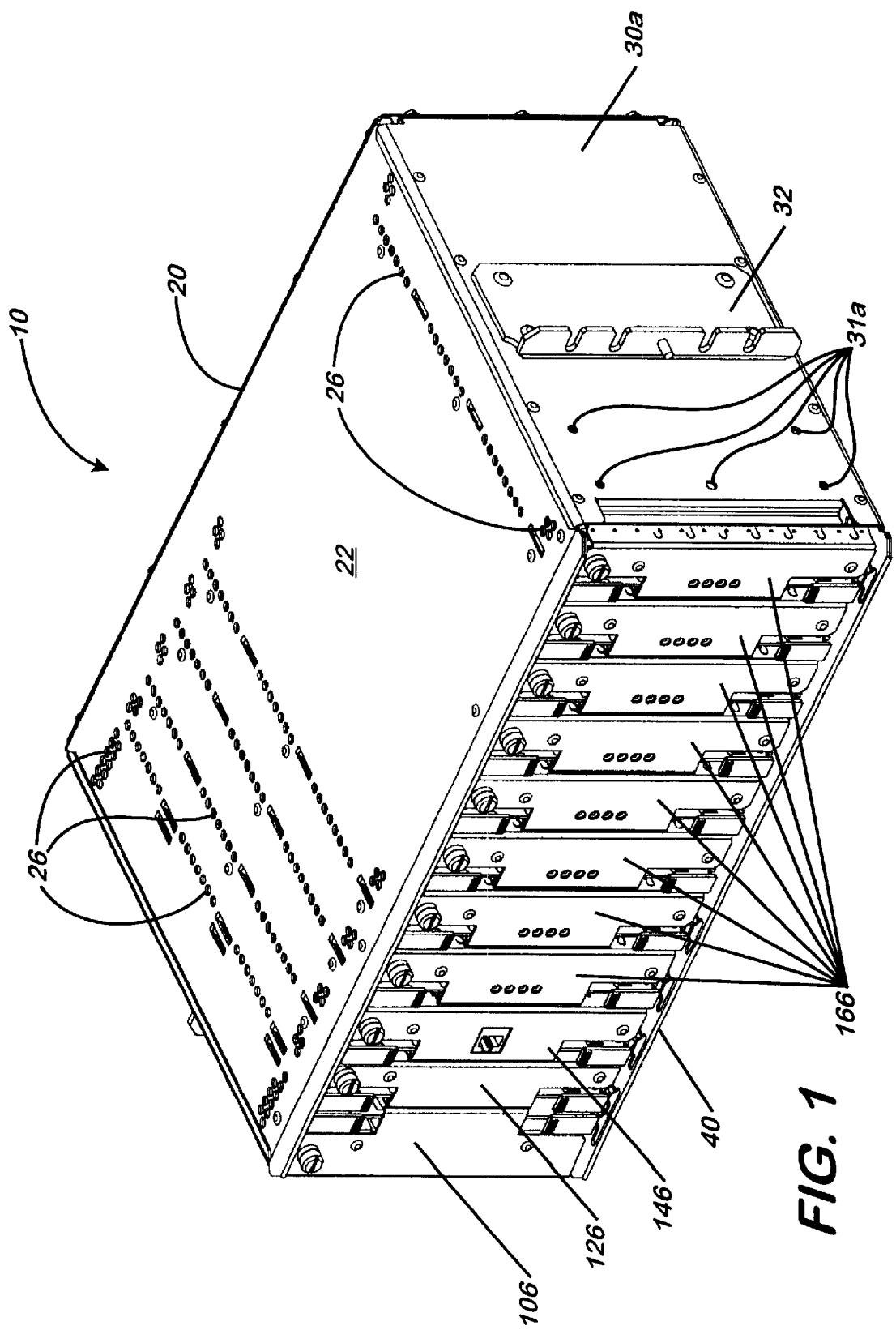
FIG. 1 is a front perspective of a modem shelf according to the present invention with various examples of circuit cards installed.

The following is a detailed description of a preferred embodiment of a modem shelf according to the present invention. The modem shelf described below and shown in the drawings is but one example of a modem shelf according to the claims. Wherever possible, the same reference numbers will be used throughout the drawings to refer to the same or like parts.

Figure 1A:
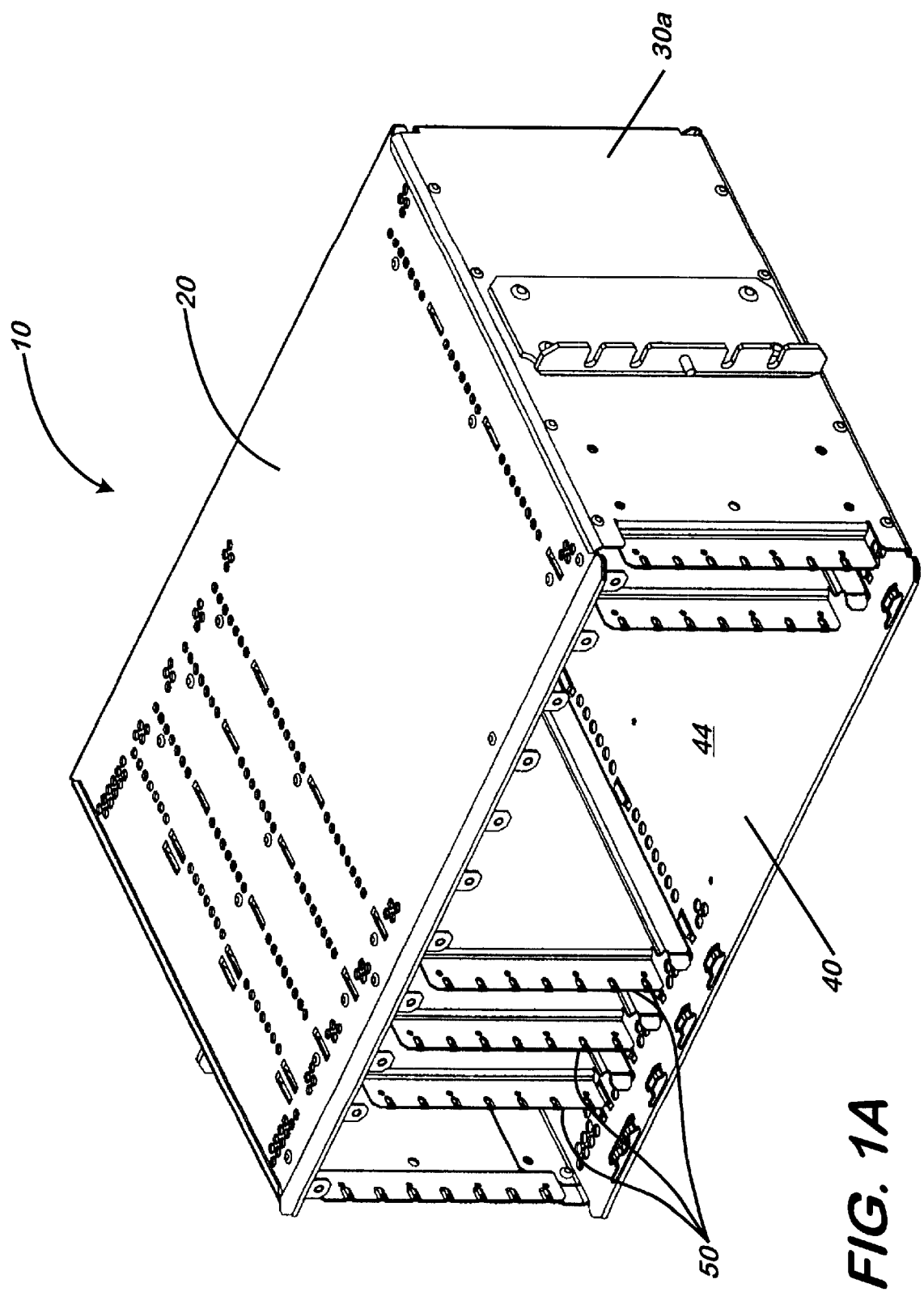
FIG. 1A is a front perspective of the modem shelf of FIG. 1 without circuit cards installed and without a full complement of dividers installed.
Figure 1B:
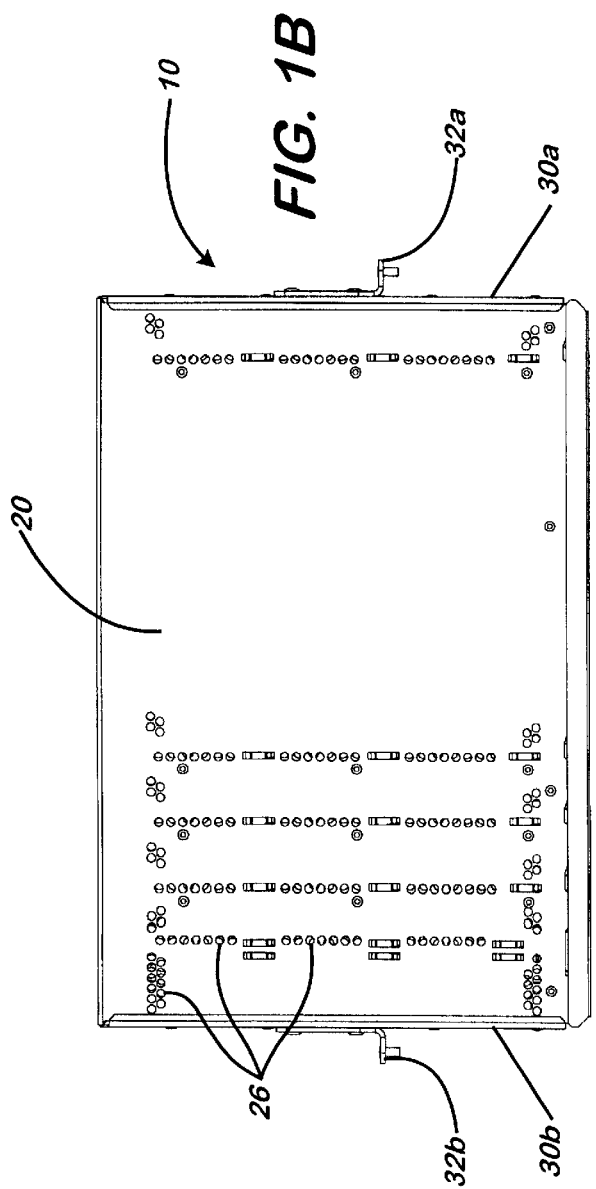
FIG. 1B is a top plan view of the modem shelf of FIG. 1 without circuit cards installed.
Figure 1D:
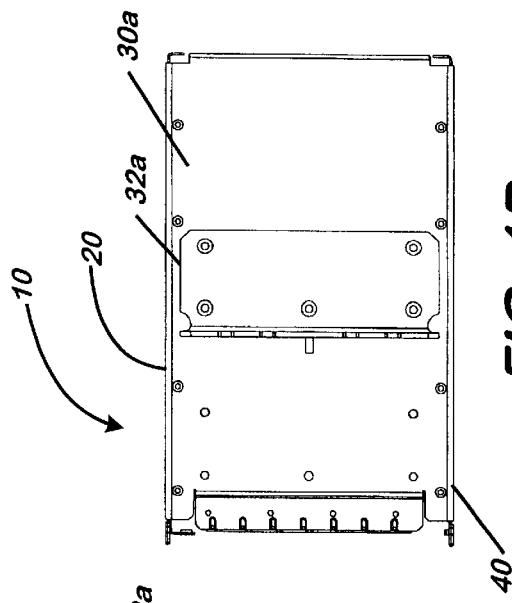
FIG. 1D is a right side elevation of the modem shelf of FIG. 1 without circuit cards installed.

FIG. 1 generally illustrates a fully assembled modem shelf 10 having circuit cards installed in the card slots defined within shelf 10. Shelf 10 could be generally described as a box divided into slots for circuit cards with appropriate connector hardware on the back side of the box. As shown in FIG. 1, shelf 10 comprises among other components, top 20, first side 30a, second side 30b (see, e.g., FIG. 3), bottom 40, back plane assembly 70 and dividers 50 (see, e.g., FIG. 1A). Top 20, sides 30a and 30b, bottom 40, back plate 72 and dividers 50 are stamped from sheet aluminum 5052-H32 about 0.040" thick. When shelf 10 is constructed of aluminum, sheet material of 0.040–0.125" thickness is acceptable and 0.040–0.060" is preferred. Materials other than aluminum may be used for these components including, but not limited to, zinc- or nickel-plated steel, stainless steel, zinc, or nickel.

Top 20 is preferably formed with flanges extending downward along its side edges. These flanges include rivet holes that mate to rivet holes in sides 30a and 30b near their respective top edges so that sides 30a and 30b may be riveted to top 20. Bottom 40 is similarly formed with upwardly extending flanges along its side edges, also having rivet holes which mate with rivet holes in sides 30a and 30b near their respective bottom edges. Bottom 40 is also riveted to sides 30a and 30b. Sides 30a and 30b, top 20 and bottom 40 thus form a four-sided aluminum box open in the front and back.

Figure 1C:
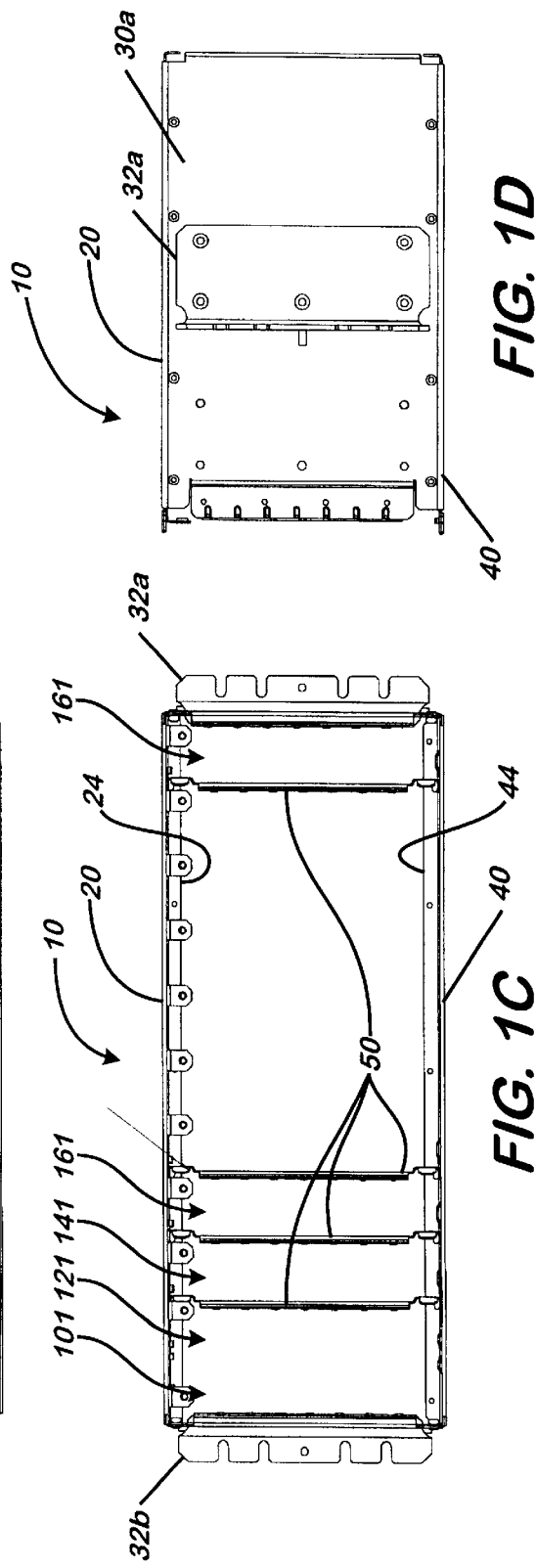
FIG. 1C is a front elevation of the modem shelf of FIG. 1 without circuit cards installed and without a full complement of dividers installed.

The card slots defined by dividers 50 and, in some cases, sides 30a and 30b are illustrated in FIG. 1C. Dividers 50 and side 30b shown on the left side of modem shelf 10 in FIG. 1C define four card slots, 101, 121, 141, and 161 for power card assembly 100 (see FIG. 4), filter card assembly 120 (see. FIG. 5), hub card assembly 140 (see FIG. 6), and modem card assembly, respectively. On the right side of FIG. 1C, divider 50 and side 30a define another modem card slot 161 (See FIG. 7) for modem card assembly 160.

FIGS. 2, 2A, 2B, and 2C illustrate divider 50 in detail, which is also preferably made of 0.040-inch-thick aluminum sheet material. Divider 50 includes suppression flange 52 and mounting flanges 56 and 58. Divider 50 is mounted in shelf 10 by riveting mounting flanges 56 and 58 to top 20 and bottom 40 respectively. Suppression protrusions 54, seven of which are shown in FIG. 2 as an example, are shown on suppression flange 52 of divider 50.

FIG. 2A illustrates the spatial relationship between suppression flange 52 of divider 50 and side wall 167 of modem front plate 166 when modem assembly 160 is mounted in shelf 10. While FIG. 2A illustrates divider 50 and modem card assembly 160, it also serves as an illustrative example of the spatial relationships among dividers 50 and the corresponding elements of the other circuit card assemblies, power card assembly 100, filter card assembly 120, and hub card assembly 140. Suppression flange 52 is nested within the space formed by front wall 165 and side wall 167 of modem front plate 166 such that EMI must travel a circuitous path P to emerge from the interior of shelf 10. The nesting of suppression flange 52 of divider 50 next to side wall 167 of front plate 166 effectively suppresses EMI that would normally emerge from the front of the shelf while allowing circuit cards like card 164 in modem card assembly 160 to be easily mounted in and removed from shelf 10.

Path P is circuitous enough that much of the EMI emitted toward the front of shelf 10 does not emerge from shelf 10 because the wavelength of much of the EMI is too short for the EMI to bend sufficiently to follow path P. The geometry of path P is defined by the distance between suppression flange 52 and side wall 167 and the degree to which suppression flange 52 and side wall 167 overlap. To sufficiently suppress EMI, the gap between suppression flange 52 and side wall 167 should be less than about 0.200". Further EMI suppression may be accomplished, by sizing the overlap between suppression flange 52 side wall 167 to accept spring-loaded, EMI-suppressing, beryllium-copper fingers (not shown) and installing them in the gap between suppression flange 52 and side wall 167. Such fingers are made, for example, by Instrument Specialties Co., Inc. and sold as Part No. 0097-0632-16.

FIGS. 2B and 2C are detailed views of one of the suppression protrusions 54 and the corresponding suppression aperture 55. FIG. 2B is a partial plan view and FIG. 2C is a partial sectional view taken along line 2C—2C of FIG. 2B. Protrusion 54 is preferably stamped into the surface of suppression flange 52 to a depth d (shown in FIG. 2C). An acceptable range for depth d is about 0.020–0.040". Protrusion 54 has a length $L_D$ and width $W_D$ and is spaced from adjacent protrusions 54 by spacing $S_D$ (see, e.g., FIG. 7A). An acceptable range for length $L_D$ is about 0.150–0.200" and a preferable range is about 0.185–0.195". An acceptable range for width $W_D$ is about 0.090–0.120" and a preferable range is about 0.100–0.110". $S_D$ should be about 0.728"±0.005". The dimensional ranges specified in this paragraph are dictated by a combination of stamping requirements and EMI-suppression performance and would not necessarily apply to a divider if it were made using a manufacturing process other than stamping.

Suppression protrusions 54 act as point reflectors that effectively scatter EMI that impinges on them. The scattering of the EMI energy effectively reduces the strength of EMI that is able to pass by suppression protrusions 54 on suppression flange 52. While suppression protrusions 54 are shown in FIG. 2B as a semi-oval shape, other shapes are possible that would have equally good EMI-suppressing characteristics. The shape shown in FIG. 2B facilitates stamping.

In order to suppress EMI more effectively, suppression apertures 55, extending through divider 50, are optionally located in suppression protrusions 54. Suppression apertures 55 act as pits into which EMI energy "falls" and scatters. Experimental results indicate that the combination of suppression protrusions 54 and suppression apertures 55 suppress EMI by about 3–10 dB (depending on the frequency of the EMI).

Figure 3:
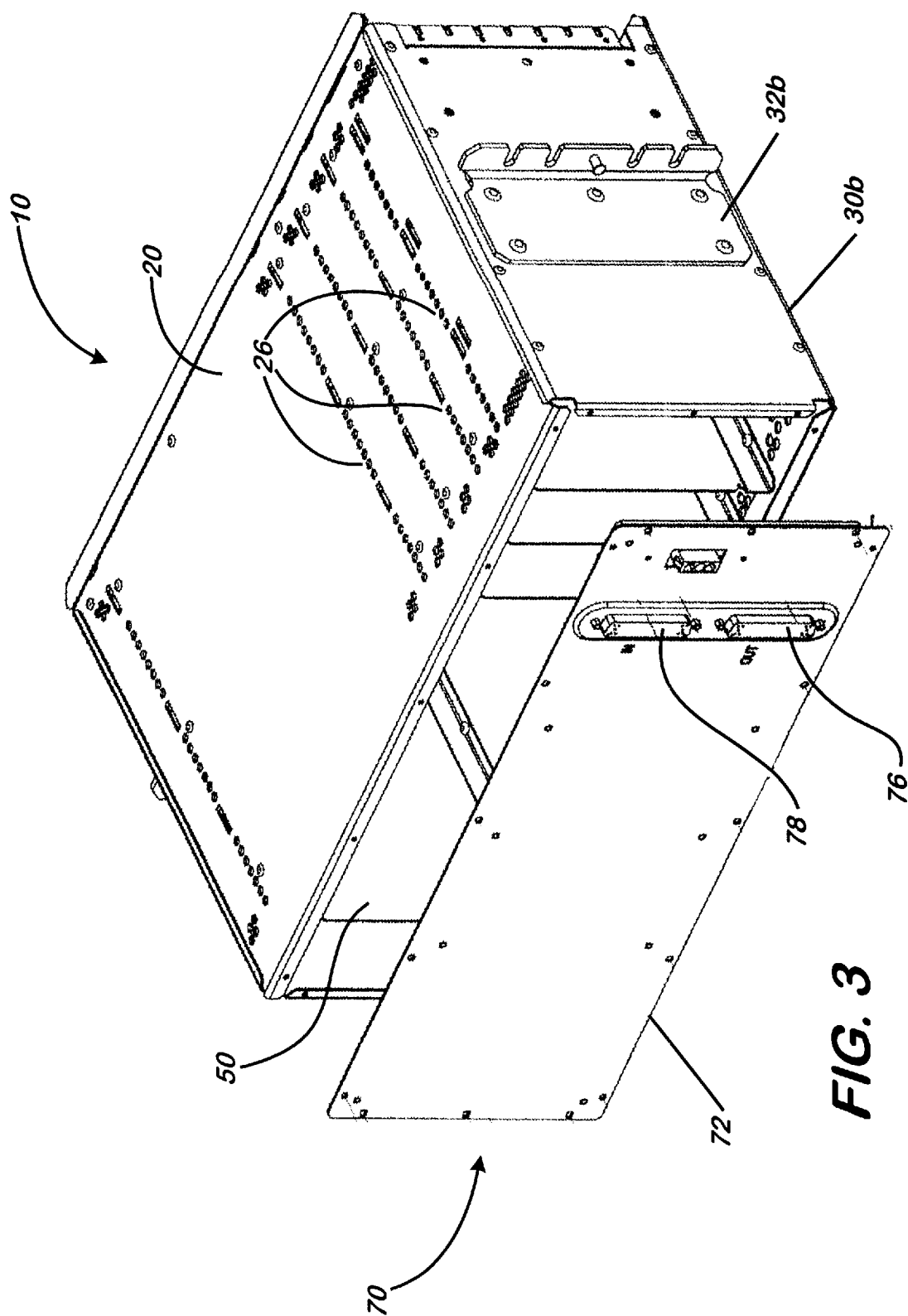
FIG. 3 is an exploded rear perspective view of the modem shelf of FIG. 1 illustrating a back plane assembly of the shelf.

As perhaps best seen in FIG. 3, the rear-facing opening of the box formed by top 20, sides 30a and 30b, and bottom 40 is closed by back plane assembly 70, which is perhaps best shown in FIGS. 3 and 3A. Back plane assembly 70 includes back plate 72, connector plate 74, and various connectors 76, 78, 80, 82, 84, 86, 88, and 90, all of which are mounted on connector plate 74. The connectors shown are DIN 41612, 3X16 (48 socket) connectors. Of course, virtually any type of standard connector can be used on connector plate 74. Back plane assembly 70 is riveted to flanges on the rear edges of top 20, bottom 40, and sides 30a and 30b respectively. Once back plane 70 is connected to the box formed by top 20, bottom 40 and sides 30a and 30b, the entire structure is strengthened significantly. Moreover, back plate 72, which is also constructed of 0.040-inch-thick aluminum sheet, effectively suppresses EMI that may enter or leave shelf 10 through the rear of shelf 10.

Connectors 76 and 78 are the output and input connectors respectively for a power card assembly 100 (see FIG. 4). Connectors 82 and 80 are the output and input connectors respectively for a filer card assembly 120 (see FIG. 5). Connectors 86 and 84 are the output and input connectors respectively for a hub card assembly 140 (see FIG. 6). Connectors 90 and 88 are the output and input connectors respectively for a modem card assembly 160 (see FIGS. 7 and 7A).

Top 20 and bottom 40 are considerably thinner (about 0.040") than conventional tops and bottoms of modem shelves, which are typically about 0.25–1.00" thick. Because top 20 and bottom 40 are so thin, they would not support even the weight of circuit cards installed in a box formed exclusively by top 20, bottom 40 and sides 30a and 30b. However, dividers 50 (see FIG. 2), which are riveted to top 20 and bottom 40 at locations to define individual card slots, substantially stiffen shelf 10. Because of the structural reinforcement provided by dividers 50, shelf 10 is considerably stiffer than conventional modem shelves, even with the relatively thin top 20 and bottom 40.

The thin top 20 and bottom 40 maximize the vertical space available for circuit cards in shelf 10. The distance from the top surface 24 of the top 20 to the bottom surface 44 of the bottom 40 defines the external height (T) of any particular modem shelf. Under MIL-STD 189, 4U, a common standard for modem shelves, T must be no more the 6.96". A portion of height T is used up in the thickness of the top and bottom of the shelf. Another portion of height T is used up by the thickness of circuit card mounting hardware connected to the internal surfaces of the top and bottom. The maximum height of a circuit board (C) that fits into a modem shelf is the portion of height T left over after top and bottom thickness and mounting hardware are considered. One common method of quantifying the efficiency with which vertical space is used inside a modem shelf is to calculate the ratio of C to T.

For shelf 10, the relatively thin top 20 and bottom 40 increases C to 6.50" for a modem shelf complying with MIL-STD 189, 4U, Thus, C/T for shelf 10 is at least 6.50/6.96 or 0.93. Typical modem shelves have a C/T ratio of less than about 0.85. Shelf 10 can therefore accommodate circuit cards with about 7.2% more surface area in the same physical space, i.e., the interior of a modem shelf complying with MIL-STD 189, 4U.

FIGS. 4–7A illustrate examples of circuit card assemblies that are compatible with shelf 10. Power card assembly 100, filter card assembly 120, hub card assembly 140, and modem card assembly 160 are mounted in card slots 101, 121, 141, and 161 of shelf 10 respectively. All circuit card assemblies include certain components that perform substantially the same functions in each assembly including: (1) divider plates 102, 122, 142, and 162; (2) card locks 103, 123, 143, and 163; (3) circuit boards 104, 124, 144, and 164 (not the circuitry on the boards); (4) front plates 106, 126, 146, and 166; (5) front surfaces of front plates 105, 125, 145, and 165; (6) side walls 107, 127, 147, and 167; (7) EMI-shields 108, 128, 148, and 168; (8) input connectors 114, 134, 154, and 174; (9) and output connectors 116, 136, 156, and 176. The first of each of these elements is described in connection with the description of power card assembly 100 below. These descriptions serve as a description of the corresponding elements for filter card assembly 120, hub card assembly 140 and modem card assembly 160.

FIG. 4 depicts a power card assembly 100 in a perspective view from the bottom and left side in order to illustrate more clearly heat sink 115 and other components on circuit card 104 (i.e., when power card assembly is installed in shelf 10 as shown in FIG. 1, the assembly is "flipped around" so that card locks 103 are position the right side of the assembly rather than the left as shown). The figures illustrating the other circuit card assemblies (120, 140, and 160) depict the assemblies in the orientation in which they are installed in shelf 10 as shown in FIG. 1.

Power card assembly 100 includes circuit card 104, which contains the circuitry needed to provide power to all other circuit cards mounted in shelf 10. Power card assembly 100 is preferably mounted in card slot 101 on the left side of shelf 10 in order to isolate the modern cards from the noise generated by the power supply. When mounted in card slot 101, filter card assembly 120 and hub card assembly 140 shield the EMI-sensitive circuit cards 164 in modem card assemblies 160 from the EMI emitted by circuit card 104. Front plate 106 of power card assembly 100 extends in the opposite direction from the front plates 126, 146, and 166 on the other types of cards. Power card assembly 100 is mounted this way so that (1) the aperture between side wall 107 and side 30b, through which some EMI may leak, faces away from the other circuit cards 124, 144, and 164 and (2) a heat sink for circuit card 104, which generates more heat the any other type of card, may be mounted near an external wall of shelf 10 to facilitate the transmission of heat from circuit card 104 to the outside of shelf 10.

The electronic circuitry (not shown) of power card assembly 100 is located on circuit card 104. Input connector 114 and output connector 116 form the electrical interface between the circuitry on circuit card 104 and the network. The circuitry on circuit card 104 generates enough EMI that it must be contained within card slot 101. Divider plate 102, front plate 106, and EMI-shield 108 are constructed of the same 0.040-inch-thick aluminum sheet material used for the major components of shelf 10. In the embodiment shown, divider plate 102 and front plate 106 are integrally formed from a single sheet of aluminum, but they could be formed of separate pieces of aluminum.

Together, divider plate 102 and front plate 106 suppress EMI emanating from circuit card 104 in two of six directions, laterally in one direction and forward respectively. Divider plate 102 also provides a direct electrical path to ground for circuit and shielding elements on power card 100. Divider plate 102 also forms the left wall (when shelf 10 is viewed from the front) of a Faraday cage, and one of dividers 50 forms the right wall of the Faraday cage. Top 20 suppresses EMI emanating upward from circuit card 104. Bottom 40 suppresses EMI emanating downward from circuit card 104. Divider 50 suppresses EMI emanating laterally from circuit card 104 (in the direction opposite the direction from circuit card 104 to divider plate 102). Connector plate 74 suppresses most of the EMI emanating rearward from circuit card 104. Any EMI bypassing connector plate 74 is further suppressed by back plate 72. EMI-shield 108 suppresses EMI that would emanate through the notch cut in the top of front plate 106 to accommodate circuit card locks 103. A second EMI-shield (not shown in FIG. 4) similar to EMI-shield 108 suppresses EMI that would emanate from the bottom notch in front plate 106. Thus, circuit card 104 is substantially completely surrounded by an aluminum Faraday cage, which effectively suppresses EMI generated by circuit card 104 and isolates circuit card 104 from EMI originating outside this Faraday cage. The shape of front plate 106 and the functions of front wall 105 and side wall 107 are the same as those described above in connection with FIG. 2A and front plate 166, front wall 165 and side wall 167 and their spatial and functional relationships to divider 50. Additionally, power card assembly 100 includes suppression protrusions 118 and suppression apertures 119, which function similarly to suppression protrusions 178 and suppression apertures 179 described above in connection with FIG. 2A.

Heat sink 115, an element which is unique to power card assembly 100, is thermally connected to the power supply elements mounted on circuit card 104 in order to conduct heat away from these circuit elements and transfer that heat into the surrounding environment. Top apertures 26 are located in various locations on top 20 in order to permit air to circulate through shelf 10 to aid in cooling the circuitry on circuit cards 104, 124, 144, and 164 mounted in shelf 10. Top apertures 26 are about 0.2" or less in diameter so that typical debris, like a #4 panhead screw, would not pass through one of top apertures 26. A pattern of top apertures 26 like that located immediately above each of card slots 101, 121, 141, and 161 are located above all card slots, which are not shown on the right hand side of shelf 10 in the figures for clarity. The particular pattern of top apertures 26 is not critical and, of course, could be varied while still accomplishing the goals of aiding heat transfer while preventing debris from entering shelf 10.

As seen in FIG. 3, bottom 40 has a series of bottom apertures 46 that are positioned on bottom 40 in a similar pattern to the pattern of top apertures 26. However, bottom apertures 46 are preferably larger in diameter than top apertures 26, about 0.25" for example. The larger diameter of bottom apertures 46 allows debris of typical sizes to fall out of shelf 10 through one of bottom apertures 46. Bottom apertures 46 also permit air to circulate through shelf 10 to aid in cooling the circuitry on circuit cards 104, 124, 144, and 164 mounted in shelf 10. Just as with top apertures 26, the particular pattern of bottom apertures 46 is not critical and bottom apertures 46 are located in portions of bottom 40 that are not illustrated in FIG. 3.

FIG. 5 depicts a filter card assembly 120. In general, the functions of elements 122, 123, 124, 125, 126, 127, 128, 134, and 136 of filter card assembly 120 are substantially the same as elements 102, 103, 104, 105, 106, 107, 108, 114, and 116 described above in connection with power card assembly 100. Filter card assembly 120 includes circuit card 124, which contains the circuitry needed to separate voice and data signals fed to it by circuit card 144. The voice signal is sent to telephony line cards. Data is sent to each circuit card 164, and back to the circuit card 144 to route to 10 BaseT or 100 BaseT connectors (for example, a high-speed internet service providers). Filter card assembly 120 is shown mounted in card slot 121 next to card slot 101 in shelf 10 and divides voice and data signals before routing to circuit cards 164. In the embodiment of circuit card 124 shown, only voice signals, low frequency signals, pass near the front edge of circuit card 124. Thus, suppression protrusions and suppression apertures 54 and 55 are not needed in side wall 127. However, they could be stamped into side wall 127 if the circuitry on circuit card 124 were laid out differently.

FIG. 6 depicts a hub card assembly 140. The functions of elements 142, 143, 144, 145, 146, 147, 148, 154, and 156 of hub card assembly 140 are substantially the same as elements 102, 103, 104, 105, 106, 107, 108, 114, and 116 described above in connection with power card assembly 100. Hub card assembly 140 includes circuit card 144, which contains the circuitry needed to collect signals from circuit cards 164 and multiplex the signals onto an RJ45 output. In the embodiment of shelf 10 shown and described, hub card assembly 140 is mounted in card slot 141 between card slot 121 and the left-most card slot 161 in shelf 10. However, any physical location in shelf 10 is possible.

Along with the elements generally present in the other card assemblies, hub card assembly 140 further includes connector socket 155. In the embodiment shown, socket 155 is an RJ45 socket through which the circuitry of circuit card 144 and thus all eight modem card assemblies 160 are connected to a communications or other network. In the embodiment of circuit card 144 shown, a relatively low level of EMI is present at the front edge of circuit card 144. Thus, suppression protrusions and suppression apertures 54 and 55 are not needed in side wall 147. However, they could be stamped into side wall 147 if the circuitry on circuit card 144 were laid out differently.

FIGS. 7 and 7A depict a modem card assembly 160. The functions of elements 162, 163, 164, 165, 166, 167, 168, 174, and 176 of modem card assembly 160 are substantially the same as elements 102, 103, 104, 105, 106, 107, 108, 114, and 116 described above in connection with power card assembly 100. Each of modem card assemblies 160 includes circuit card 164, which contains the circuitry needed to send and receive data/voice signals from a remote modem and place them onto the telephony network where they may be switched like purely voice signals. Modem card assemblies 160 are shown mounted in card slots 161 to the right of card slot 141 but could be mounted in other locations. Only two card slots 161 are shown in FIG. 1C for simplicity, but card slots 161 essentially fill shelf 10 from the left-hand card slot 161 to the right-hand card slot 161. Thus, shelf 10 could hold as many as eight modem card assemblies 160 (see, e.g., FIG. 1).

FIG. 8 illustrates a bracket 32 that allows shelf 10 to be mounted in a number of different standard relay rack configurations by appropriately mounting bracket 32 on different parts of shelf 10 and in different orientations. Shelf 10 is shown in FIG. 1 to have two brackets 32a and 32b attached to sides 30a and 30b respectively. The location and orientation in which brackets 32a and 32b are mounted on shelf 10 allows shelf 10 to be mounted in a standard, center mounted, 19" relay rack. However, at least one alternate mounting location for brackets 32a and 32b exists. As seen in FIG. 1, mounting holes 31a are located forward of the position on side 30a at which bracket 32a is mounted. Mounting holes 31a allow bracket 32a to be moved to this forward location when shelf 10 is to be mounted in a relay rack requiring such a bracket location. As shown in FIG. 1, brackets 32a and 32b are shown to be riveted to sides 30a and 30b, but alternative mounting mechanisms could be used including, but not limited to, screws and adhesives. Using one of two different brackets mounted in one of two different locations on sides 30a and 30b, a user can configure shelf 10 in a 19-inch, center-mounted mode (for typical commercial data applications); a 19-inch, front-mounted mode (for typical CATV applications); or a 23-inch, center-mounted mode (for typical telephone central office applications). Brackets 32a and 32b are used for both 19-inch configurations and a bracket (not shown) with a longer flange 37 is used for the 23-inch configuration. Thus, brackets 32a and 32b allow shelf 10 to be mounted in all typical rack configurations with little or no specialized hardware for a particular installation.

It will be apparent to those skilled in the art that various modifications and variations can be made in the modem shelf of the present invention and in construction of this modem shelf without departing from the scope or spirit of the invention. Other embodiments of the invention will be apparent to those skilled in the art from their consideration of the specification and practice of the invention disclosed in this document. The applicant intends that the specification and examples be considered as exemplary only, with a true scope and spirit of the invention being indicated by the following claims.

What is claimed is:

1. A shelf for mounting a plurality of circuit cards, comprising:
   A. an exterior shell made of EMI-shielding material and defining an internal space comprising:
      i. a top,
      ii. a first side connected to the top,
      iii. a second side connected to the top, and
      iv. a bottom connected to the first side and the second side; and
   B. a divider made of EMI-shielding material that:
      i. is connected to the top of the exterior shell and the bottom of the exterior shell, and
      ii. separates the internal space into a first card slot and a second card slot; such that the portion of the exterior shell surrounding each of the first and second card slots and the divider suppresses EMI generated by one of the circuit cards mounted in either the first or the second card slot.

2. The shelf of claim 1, in which the divider acts as a stress member to provide stiffness to the shelf and the top and the bottom define an external height and an intern al height such that a ratio of the internal height to the external height is at least about 0.93.

3. The shelf of claim 1, further comprising:
   A. a back plate made of EMI-shielding material;
   B. a front plate made of EMI-shielding material that:
      i. is located at a front side of the exterior shell and
      ii. spans at least one of the card slots from the top to the bottom of the exterior shell.

4. The shelf of claim 1, further comprising:
   A. a first mounting position at a first mounting location on an outer surface of the exterior shell;
   B. a second mounting position at a second mounting location on the outer surface of the exterior shell; and C. a mounting bracket that may be attached to either the first or the second mounting position in order to configure the shelf to be compatible with a front-mounted shelf stand or a center-mounted shelf stand.

5. The shelf of claim 1, in which the exterior shell further comprises:

A. a plurality of top apertures through the top; and

B. a plurality of bottom apertures through the bottom.

6. The shelf of claim 1, in which:

A. at least one of the card slots is adapted to receive a power card and

B. each of the remaining card slots is adapted to receive a modem card.

7. The shelf of claim 1, further comprising at least two of the dividers defining at least three of the card slots and in which:

A. at least one of the card slots is adapted exclusively to receive a power card;

B. at least one of the card slots is adapted exclusively to receive a filter card; and C. each of the remaining card slots is adapted to receive a modem card.

8. The shelf of claim 1, further comprising at least three of the dividers defining at least four of the card slots and in which:

A. at least one of the card slots is adapted exclusively to receive a power card;

B. at least one of the card slots is adapted exclusively to receive a filter card;

C. at least one of the card slots is adapted exclusively to receive a hub card; and D. each of the remaining card slots is adapted to receive a modem card.

9. The shelf of claim 3, in which the front plate comprises:

A. a front wall and

B. a side wall connected to a first lateral edge of the front wall and extending toward the internal space of the exterior shell to overlap at least partially with the divider.

10. The shelf of claim 6, in which the card slot adapted exclusively to receive the power card is located adjacent the first side of the exterior shell and further comprising a heat sink, thermally connected to the first side of the exterior shell, which is adapted to transfer heat away from the power card.

11. The shelf of claim 7, in which the card slot adapted exclusively to receive the power card is located adjacent the first side of the exterior shell and further comprising a heat sink, thermally connected to the first side of the exterior shell, which is adapted to transfer heat away from the power card.

12. The shelf of claim 8, in which the card slot adapted exclusively to receive the power card is located adjacent the first side of the exterior shell and further comprising a heat sink, thermally connected to the first side of the exterior shell, which is adapted to transfer heat away from the power card.

13. The shelf of claim 1, further comprising a plurality of suppression protrusions located on an inside surface of the side wall such that the suppression protrusions suppress EMI that encounters the inside surface of the side wall.

14. The shelf of claim 13, in which the suppression protrusions:

A. are spaced apart from the center of one of the suppression protrusions to the center of the adjacent suppression protrusion by about 0.723–0.823 inches;

B. protrude from the inside surface of the side wall by 0.020–0.040 inches;

C. are from about 0.090–0.120 inches wide; and

D. are from about 0.150–0.200 inches long.

15. The shelf of claim 14, in which the side wall further comprises a plurality of suppression apertures, with each suppression aperture extending through one of the suppression protrusions and the side wall.

16. The shelf of claim 15, further comprising a divider plate made of EMI-shielding material and connected to a second lateral edge of the front plate opposite the first lateral edge of the front plate and extending into the interior of the shelf such that it substantially spans the space between the front plate, the back plate, the top and the bottom of the shelf.

* * * * *